United States Patent
Afridi et al.

(10) Patent No.: US 11,502,542 B2
(45) Date of Patent: Nov. 15, 2022

(54) MULTI-MODULAR CAPACITIVE WIRELESS POWER TRANSFER CIRCUIT AND RELATED TECHNIQUES

(71) Applicant: The Regents of the University of Colorado, Denver, CO (US)

(72) Inventors: Khurram K Afridi, Boulder, CO (US); Brandon Regensburger, Boulder, CO (US); Sreyam Sinha, Boulder, CO (US); Ashish Kumar, Boulder, CO (US); Zoya Popovic, Boulder, CO (US)

(73) Assignee: The Regents of the University of Colorado, Denver, CO (US)

( * ) Notice: Subject to any disclaimer, the term of this patent is extended or adjusted under 35 U.S.C. 154(b) by 53 days.

(21) Appl. No.: 16/636,211

(22) PCT Filed: Aug. 1, 2018

(86) PCT No.: PCT/US2018/044879
§ 371 (c)(1),
(2) Date: Feb. 3, 2020

(87) PCT Pub. No.: WO2019/028180
PCT Pub. Date: Feb. 7, 2019

(65) Prior Publication Data
US 2020/0373783 A1 Nov. 26, 2020

Related U.S. Application Data

(60) Provisional application No. 62/539,918, filed on Aug. 1, 2017.

(51) Int. Cl.
*H02J 50/05* (2016.01)
*H02J 50/40* (2016.01)
(Continued)

(52) U.S. Cl.
CPC ............ *H02J 50/05* (2016.02); *B60L 53/122* (2019.02); *H02J 50/40* (2016.02); *H03H 7/38* (2013.01)

(58) Field of Classification Search
CPC ........ H02J 50/05; H02J 2310/48; H02J 50/40; H02J 50/402; H02J 50/70; H02J 50/80;
(Continued)

(56) References Cited

U.S. PATENT DOCUMENTS 9,397,505 B2 * 7/2016 Lee .................. H02J 50/80
9,413,175 B2 * 8/2016 Park .................. H02J 50/70
(Continued)

OTHER PUBLICATIONS

Sinha et al.; "A very-high-power-transfer-density GaN-based capacitive wireless power transfer system"; 2017 IEEE 5th Workshop on Wide Bandgap Power Devices and Applications (WiPDA); Conference Paper | Publisher: IEEE; Cited by: Papers (13) (Year: 2017).*
(Continued)

*Primary Examiner* — Helen Rossoshek
(74) *Attorney, Agent, or Firm* — FisherBroyles, LLP; Thomas J. Osborne, Jr.

(57) ABSTRACT

A high performance kilowatt-scale large air-gap multi-modular capacitive wireless power transfer (WPT) system is provided for electric vehicle (EV) charging. In one particular implementation, the multi-modular system achieves high power transfer while maintaining fringing electric fields within prescribed safety limits. The fringing fields are reduced using near-field phased-array field-focusing techniques, wherein the adjacent modules of the multi-modular system are out-phased with respect to one another. The inter-module interactions in this multi-modular system can be modeled, and an approach to eliminate these interactions in a practical EV charging environment is provided. To illustrate one example implementation, a prototype 1.2-kW 6.78-MHz 12-cm air-gap multi-modular capacitive WPT system comprising two 600-W modules is provided. This prototype system achieves 21.2 kW/m² power transfer density and a peak efficiency of 89.8%. This multi-modular
(Continued)

system also achieves a fringing field reduction of 50% compared to its individual modules.

11 Claims, 12 Drawing Sheets

(51) Int. Cl.
*B60L 53/122* (2019.01)
*H03H 7/38* (2006.01)

(58) Field of Classification Search
CPC ..... H02J 7/0013; H02J 7/0047; B60L 53/122; B60L 53/60; Y02T 10/70; Y02T 90/14; Y02T 10/7072
See application file for complete search history.

(56) References Cited

U.S. PATENT DOCUMENTS

| 10,298,058 | B2* | 5/2019 | Afridi | H02J 50/05 |
| 10,333,485 | B2* | 6/2019 | Sinha | H02J 50/10 |
| 11,171,511 | B2* | 11/2021 | Afridi | H04B 5/0037 |
| 2016/0105144 | A1* | 4/2016 | Haynes | H02S 20/26 |
| | | | | 136/244 |
| 2017/0373660 | A1* | 12/2017 | Sinha | H02J 50/05 |
| 2018/0166915 | A1* | 6/2018 | Afridi | H02J 7/025 |
| 2019/0165614 | A1* | 5/2019 | Afridi | H02M 7/23 |
| 2019/0199137 | A1* | 6/2019 | Jiang | H04B 5/0081 |
| 2019/0207420 | A1* | 7/2019 | Afridi | H04B 5/0012 |
| 2019/0319600 | A1* | 10/2019 | Afridi | B60L 5/005 |
| 2020/0195043 | A1* | 6/2020 | K. | H02M 3/33569 |
| 2020/0350816 | A1* | 11/2020 | Fischer | H02M 1/126 |
| 2021/0188106 | A1* | 6/2021 | Asa | H02J 7/0047 |

OTHER PUBLICATIONS

Regensburger et al.; "High-performance large air-gap capacitive wireless power transfer system for electric vehicle charging"; 2017 IEEE Transportation Electrification Conference and Expo (ITEC); Conference Paper | Publisher: IEEE; Cited by: Papers (43) (Year: 2017).*

* cited by examiner

MULTI-MODULAR CAPACITIVE WIRELESS POWER TRANSFER CIRCUIT AND RELATED TECHNIQUES

CROSS-REFERENCE TO RELATED APPLICATIONS

This application claims the benefit of U.S. provisional Application No. 62/539,918 entitled "MULTI-MODULAR CAPACITIVE WIRELESS POWER TRANSFER CIRCUIT AND RELATED TECHNIQUES", filed Aug. 1, 2017 of which is hereby incorporated by reference as though fully set forth herein.

GOVERNMENT LICENSE RIGHTS

This invention was made with government support under grant number DE-AR0000618 awarded by the U.S. Department of Energy. The government has certain rights in the invention.

BACKGROUND

The present disclosure relates to inverter architectures adapted to compensate for coupling variations in wireless power transfer systems.

Wireless power transfer (WPT) can enhance consumer convenience by enabling autonomous charging in applications ranging from electric vehicles (EVs) to portable Market penetration of electric vehicles (EVs) remains low, with EV sales in the US accounting for less than 1.5% of total vehicle sales. The main challenges in widespread EV adoption are high cost, limited range and long charging times, due to limitations in battery technology. An effective approach to overcome these challenges is to substantially reduce on-board energy storage and instead utilize dynamic (in-motion) wireless power transfer (WPT) to deliver energy to the vehicle. WPT for EVs can be achieved either using magnetic fields between inductively coupled coils, or using electric fields between capacitively coupled plates. Inductive WPT systems require ferrites for magnetic flux guidance; these ferrites are expensive, fragile, and necessitate a low operating frequency to limit core losses, resulting in relatively large system size. In contrast, capacitive WPT systems do not require ferrites and can operate at high frequencies, allowing these systems to be less expensive, more efficient, and more compact. Large air-gap capacitive WPT for EV charging applications have been examined. Owing to the large air-gap and the limited area available under the vehicle chassis (which together result in a very small coupling capacitance), designing high-power high-efficiency capacitive WPT systems for EV charging is very challenging. Furthermore, in practical implementations of these systems, it is imperative to maintain fringing electric fields below the prescribed safety limits.

BRIEF SUMMARY

In one implementation, a high performance kilowatt-scale large air-gap multi-modular capacitive wireless power transfer (WPT) system is provided for electric vehicle (EV) charging. In this particular implementation, the multi-modular system achieves high power transfer while maintaining fringing electric fields within prescribed safety limits. The fringing fields are reduced using near-field phased-array field-focusing techniques, wherein the adjacent modules of the multi-modular system are out-phased with respect to one another. The inter-module interactions in this multi-modular system can be modeled, and an approach to eliminate these interactions in a practical EV charging environment is provided.

To illustrate one example implementation, a prototype 1.2-kW 6.78-MHz 12-cm air-gap multi-modular capacitive WPT system comprising two 600-W modules is provided. This prototype system achieves 21.2 kW/m$^2$ power transfer density and a peak efficiency of 89.8%. This multi-modular system also achieves a fringing field reduction of 50% compared to its individual modules.

The foregoing and other aspects, features, details, utilities, and advantages of the present invention will be apparent from reading the following description and claims, and from reviewing the accompanying drawings.

BRIEF SUMMARY OF THE DRAWINGS

FIGS. 2($a$) and 2($b$) illustrate a schematic view of various capacitances present in a two-module capacitive WPT system in a practical EV charging environment: in FIG. 2($a$) viewed from the front/rear of the vehicle, and in FIG. 2($b$) viewed from the side of the vehicle.

FIGS. 3($a$) and 3($b$) illustrates schematic diagrams of circuit schematics of an example two-module capacitive WPT system: in FIG. 3($a$) with inter-module parasitic capacitances shown based on their physical manifestation, and in FIG. 3($b$) with the two modules effectively decoupled by: (1) an equivalent model for the inter-module plate-to-plate capacitances ($C_{pp}'$), valid when the modules are operated 180° out of phase, allowing the $C_{pp}$'s to be absorbed within the individual modules, and (2) by eliminating the effect of the other inter-module capacitances through symmetrically split inductor design.

FIGS. 6($a$), 6($b$) and 6($c$) illustrates graphs showing measured waveforms of the prototype multi-module capacitive WPT system operating at 1275 W: FIG. 6($a$) shows inverter switch node voltages and currents of module 1, FIG. 6($b$) shows inverter switch node voltages and currents of module 2, and FIG. 6($c$) system input voltage and current, and the output voltages of the two modules.

DETAILED DESCRIPTION

Architecture of Multi-Modular Capacitive WPT System

Figure 1:
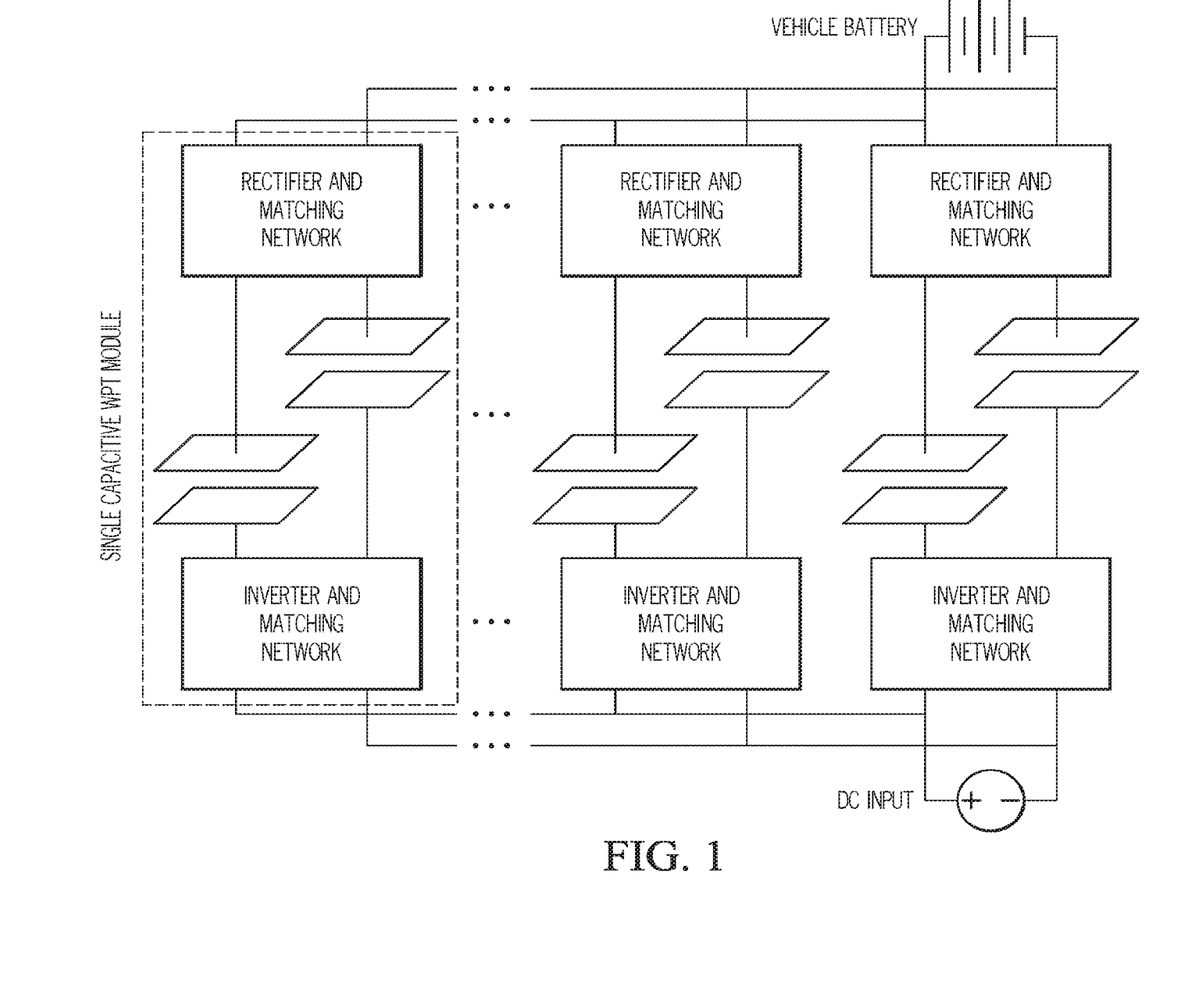
FIG. 1 illustrates a schematic diagram of an example architecture for a multi-modular capacitive WPT system in which each module comprises two pairs of coupling plates, a high-frequency inverter and rectifier, and matching networks that provide gain and reactive compensation.

An example architecture of a large air-gap multi-modular capacitive WPT system for EV charging is shown in FIG. 1. Wireless power transfer in the individual modules of this system is accomplished using two pairs of conducting plates, for example, one pair embedded in a vehicle chassis, and another pair embedded in a road or a garage or parking space floor. In this particular implementation, each module comprises a high-frequency inverter and rectifier, and matching networks that enable effective power transfer by providing voltage and/or current gain and reactive compensation. The inverters of the adjacent modules of this multi-modular system are operated with a phase-shift relative to one another. By appropriately selecting this phase-shift, the fringing electric fields generated by adjacent modules can be canceled, ensuring that the field strengths in areas of concern, such as the regions beyond the vehicle chassis, are maintained below prescribed safety limits.

Modeling and Mitigation of Inter-Module Interactions

Figure 2A:
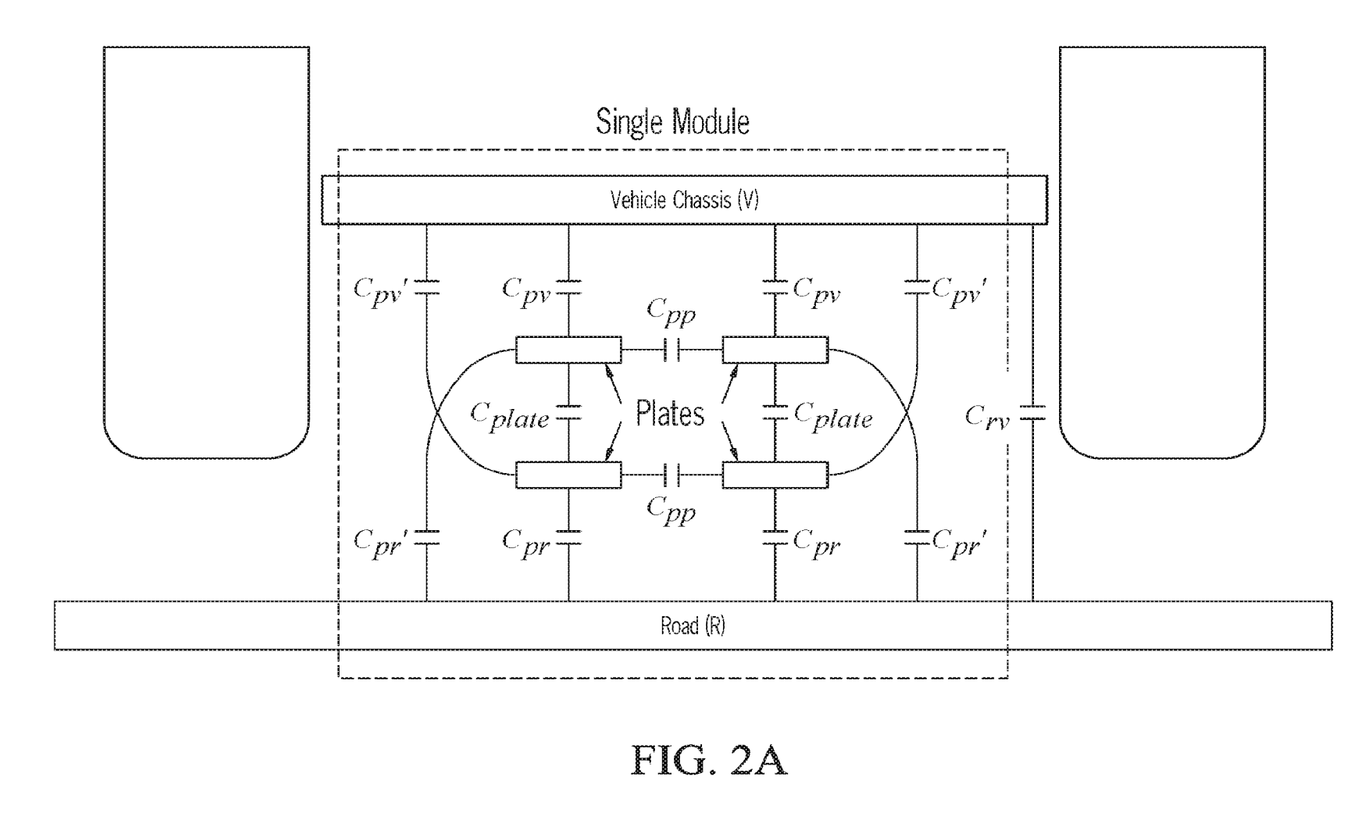
Figure 2B:
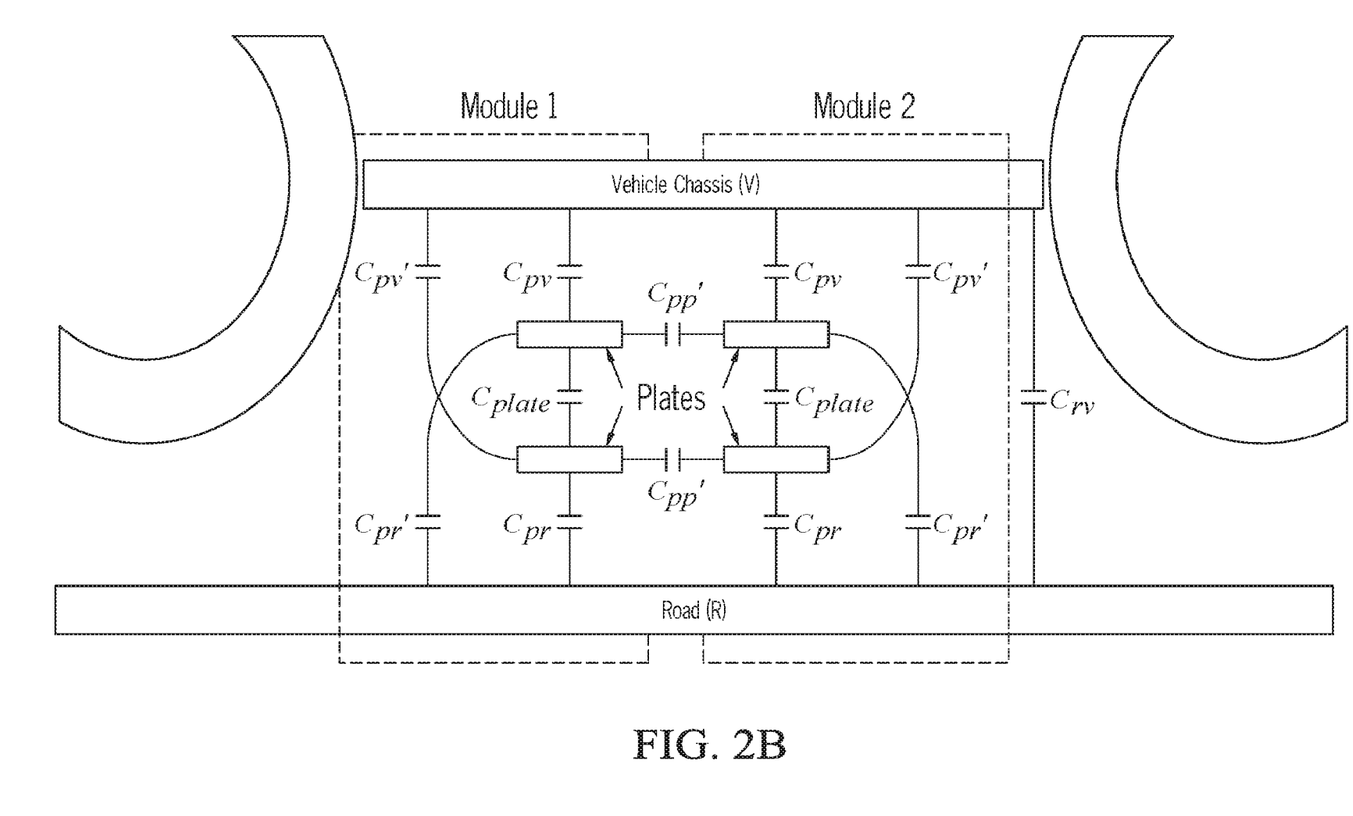

The couplers in each module of the multi-modular capacitive WPT system of FIG. 1 would ideally be equivalent to two coupling capacitances. However, several additional parasitic capacitances exist in a practical EV charging scenario, as shown for a two-module capacitive WPT system shown in FIGS. 2(a) and 2(b). FIG. 2(a) shows these capacitances as viewed from the front/rear of the vehicle, and FIG. 2(b) provides a side view. These parasitic capacitances create undesirable intra-module and inter-module interactions, which can severely degrade power transfer and efficiency, particularly when operating at high (e.g., multi-MHz) frequencies. Therefore, to achieve high power transfer levels and high efficiencies, ways to decouple the individual modules from one another and absorb the parasitic capacitances within each module can be identified. An example approach is discussed below.

Figure 3A:
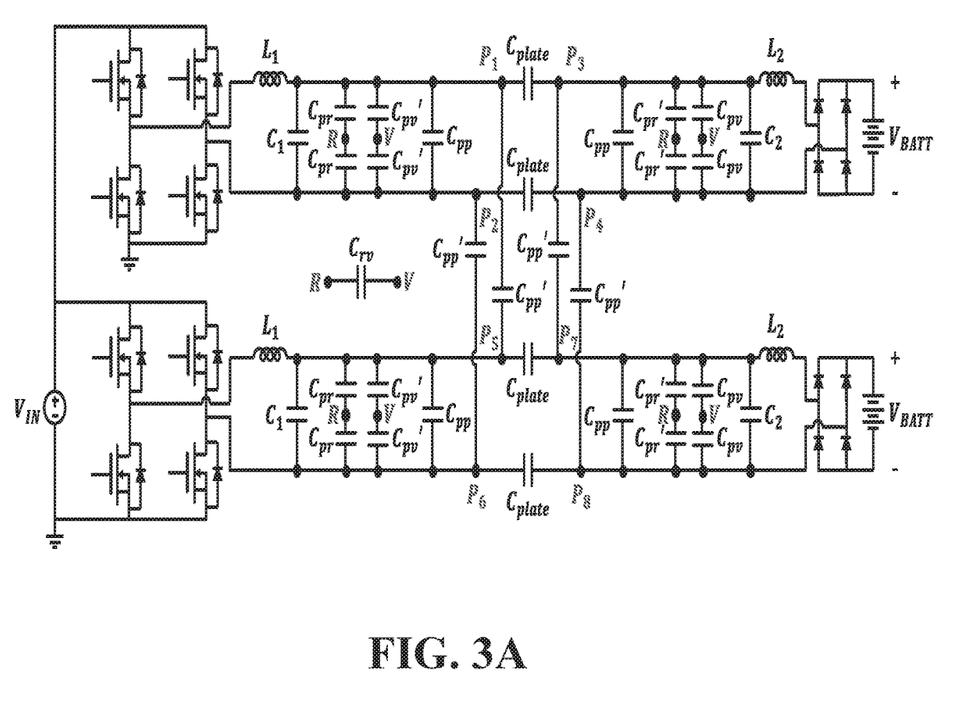
Figure 3B:
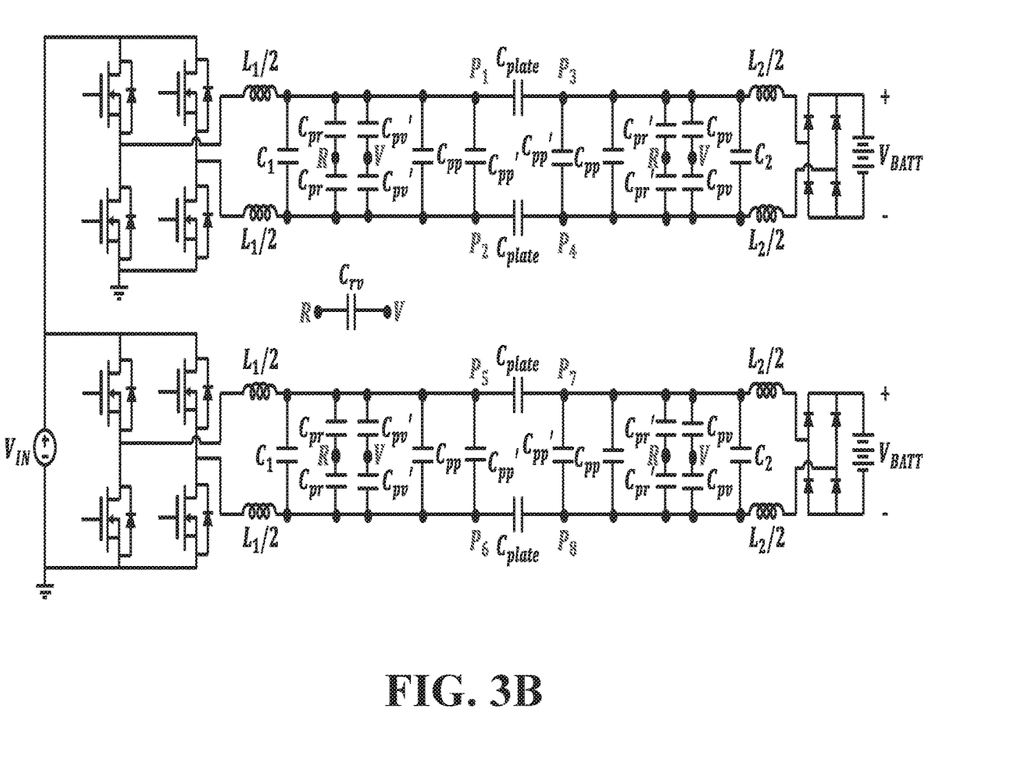

A circuit schematic of an example two-module capacitive WPT system incorporating the parasitic capacitances, and utilizing L-section matching networks for gain and compensation, is shown in FIG. 3(a). In this implementation, the two modules have identical designs, and their inverters are operated at a relative phase-shift of 180° to maximize fringing field cancelation. Using phasor analysis under this 180°-phased condition, it can be shown that the effect of the inter-module plate-to-plate capacitances (labeled as $C_{pp}'$ in FIG. 3(a)) can be modeled using capacitances of the same magnitude appearing inside the individual modules, as shown in FIG. 3(b); hence, partially decoupling the two modules. This can be understood as follows. Since the two modules are phased apart by 180°, the node $P_2$ in the top module is at the same voltage as the node $P_5$ in the bottom module, both relative to the inverter ground. Therefore, the current that flows from node $P_1$ in the top module to node $P_5$ in the bottom module through the inter-module capacitance $C_{pp}'$ can be equivalently modeled by the same current flowing between nodes $P_1$ and $P_2$ of the top module, through a capacitance of the same value $C_{pp}'$. Similarly, the other inter-module capacitance $C_{pp}'$ between nodes $P_2$ and $P_6$ can be modeled by a capacitance of the same value between nodes $P_5$ and $P_6$ of the bottom module. A similar modeling approach applies to the vehicle-side inter-module plate-to-plate capacitances. The two modules in FIG. 3(b) are still coupled to one another through the plate-to-road capacitances, $C_{pr}$ and $C_{pr}'$, and the plate-to-vehicle capacitances, $C_{pv}$ and $C_{pv}'$. The effect of these capacitances is mitigated by enforcing circuit symmetry, wherein the inductors of the L-section matching networks in both modules ($L_1$ and $L_2$) are split into two equal halves, one in the forward and the other in the return path, as also shown in FIG. 3(b). This ensures that the voltages at the two same-side coupling plates in each module (for instance, nodes $P_1$ and $P_2$ in FIG. 3(b)), relative to the road and vehicle chassis (nodes R and V in FIG. 3(b), respectively), are equal in magnitude and opposite in phase. As a result, the current that flows through one pair of coupling plates in a module is equal to the return current through the other pair in the same module; hence, the two modules appear fully decoupled. Furthermore, in this symmetrically-designed decoupled system, the parasitic capacitances can be used to fully realize the matching network capacitors of the individual modules, as shown in FIG. 4, where $$C_{ps1}\left(=C_{pp}+C_{pp}'+\frac{C_{pr}}{2}+\frac{C_{pv}'}{2}\right) \text{ and } C_{ps2}\left(=C_{pp}+C_{pp}'+\frac{C_{pv}}{2}+\frac{C_{pr}'}{2}\right)$$

are utilized as the required matching network capacitances. This eliminates the need for discrete capacitors that are prone to dielectric breakdown, and enables the parasitic capacitances to enhance, rather than degrade, power transfer. Note that this approach to modeling and mitigating inter-module interactions and absorbing parasitic capacitances into the matching networks of individual modules can be extended to a multi-modular system comprising a higher number of modules.

Figure 4:
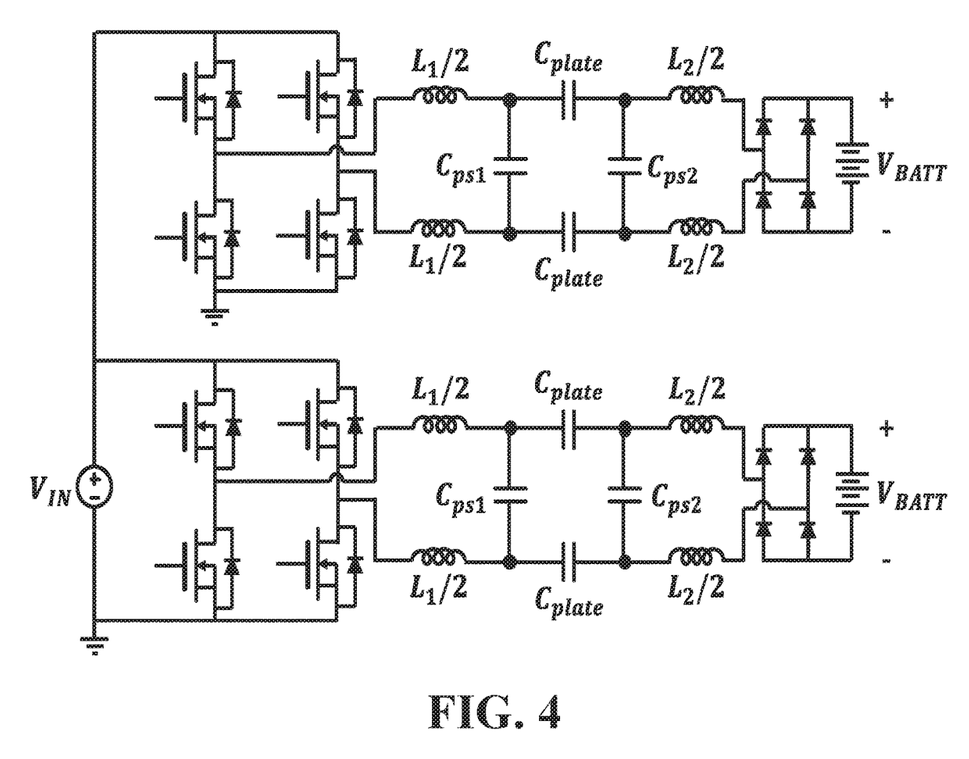
FIG. 4 illustrates a schematic diagram showing an example circuit schematic of a two-module capacitive WPT system with matching network capacitances realized using parasitic capacitances.

The L-section matching networks of the capacitive WPT system of FIG. 4 provide voltage and/or current gain, and compensate for the reactance of the coupling plates. A framework for optimally designing the matching networks of a single-module capacitive WPT system was presented in S. Sinha, A. Kumar, S. Pervaiz, B. Regensburger and K. K. Afridi, "Design of Efficient Matching Networks for Capacitive Wireless Power Transfer Systems," *Proceedings of the IEEE Workshop on Control and Modeling for Power Electronics (COMPEL)*, Trondheim, Norway, June 2016 (hereinafter "Sinha," which is incorporated by reference herein), and guidelines for ensuring that the inductors of these matching networks have sufficiently high quality factors and self-resonant frequencies were presented in K. Doubleday, A. Kumar, S. Sinha, B. Regensburger, S. Pervaiz and K. K. Afridi, "Design Tradeoffs in a Multi-Modular Capacitive Wireless Power Transfer System," *Proceedings of the IEEE PELS Workshop on Emerging Technologies: Wireless Power Transfer (WoW)*, Knoxville, Tenn., October 2016 (hereinafter "Doubleday," which is incorporated by reference herein). The work in B. Regensburger, A. Kumar, S. Sinha, K. Doubleday, S. Pervaiz, Z. Popović, K. K. Afridi, "High-Performance Large Air-Gap Capacitive Wireless Power Transfer System for Electric Vehicle Charging," *Proceedings of the IEEE Transportation Electrification Conference and Expo (ITEC)*, Chicago, Ill., June 2017 (hereinafter "Regensburger," which is incorporated by reference herein) leverages the framework and guidelines of Sinha and Doubleday to develop a comprehensive design methodology for designing the matching networks of a single-module capacitive WPT system. Since the modules of the multi-modular system presented here are effectively decoupled using the above-described approach, the methodology of Regensburger can be utilized to design the matching networks of each module.

Prototype Design and Experimental Results

Figure 5:
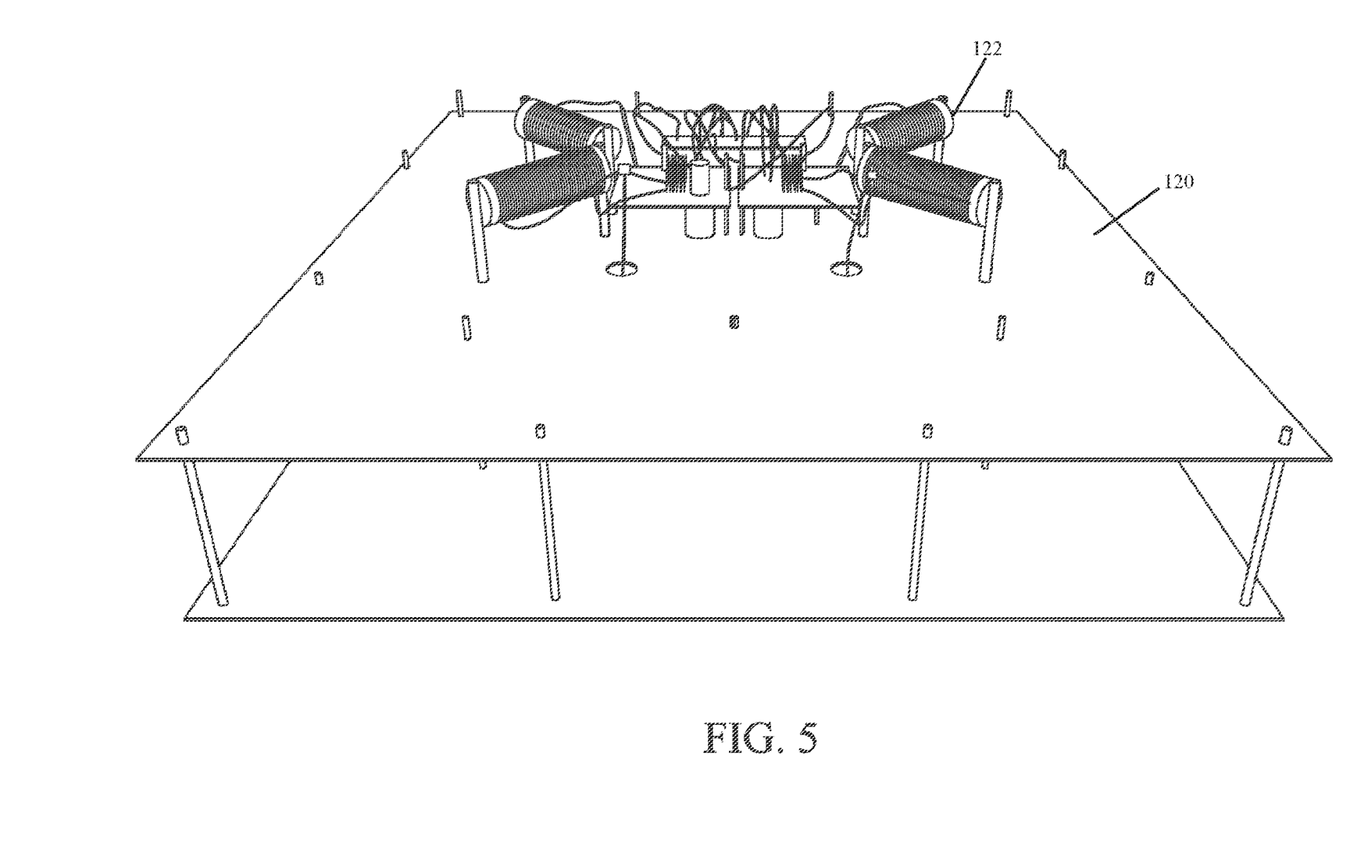
FIG. 5 is a perspective view of a prototype multi-modular capacitive WPT system.
Figure 6A:
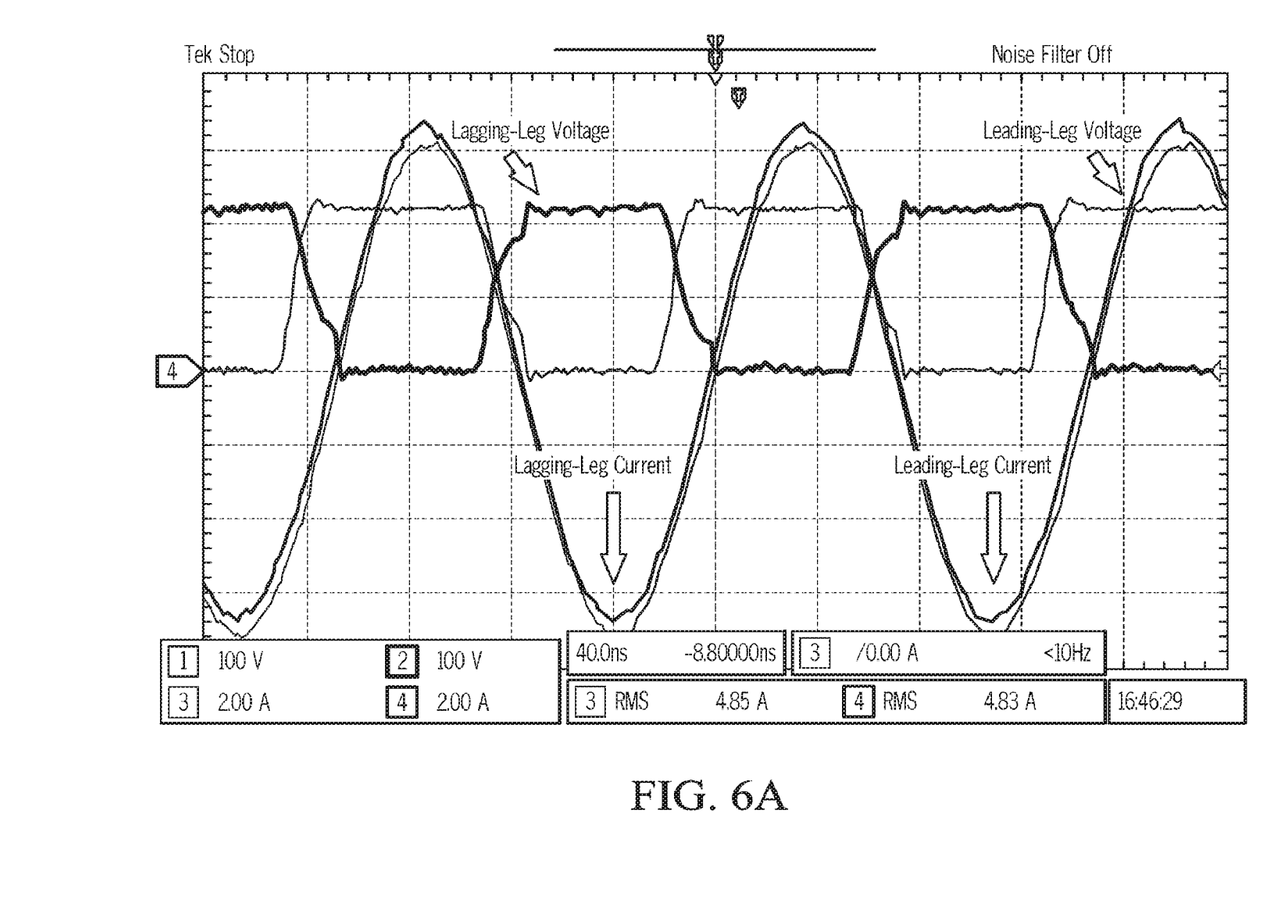
Figure 6B:
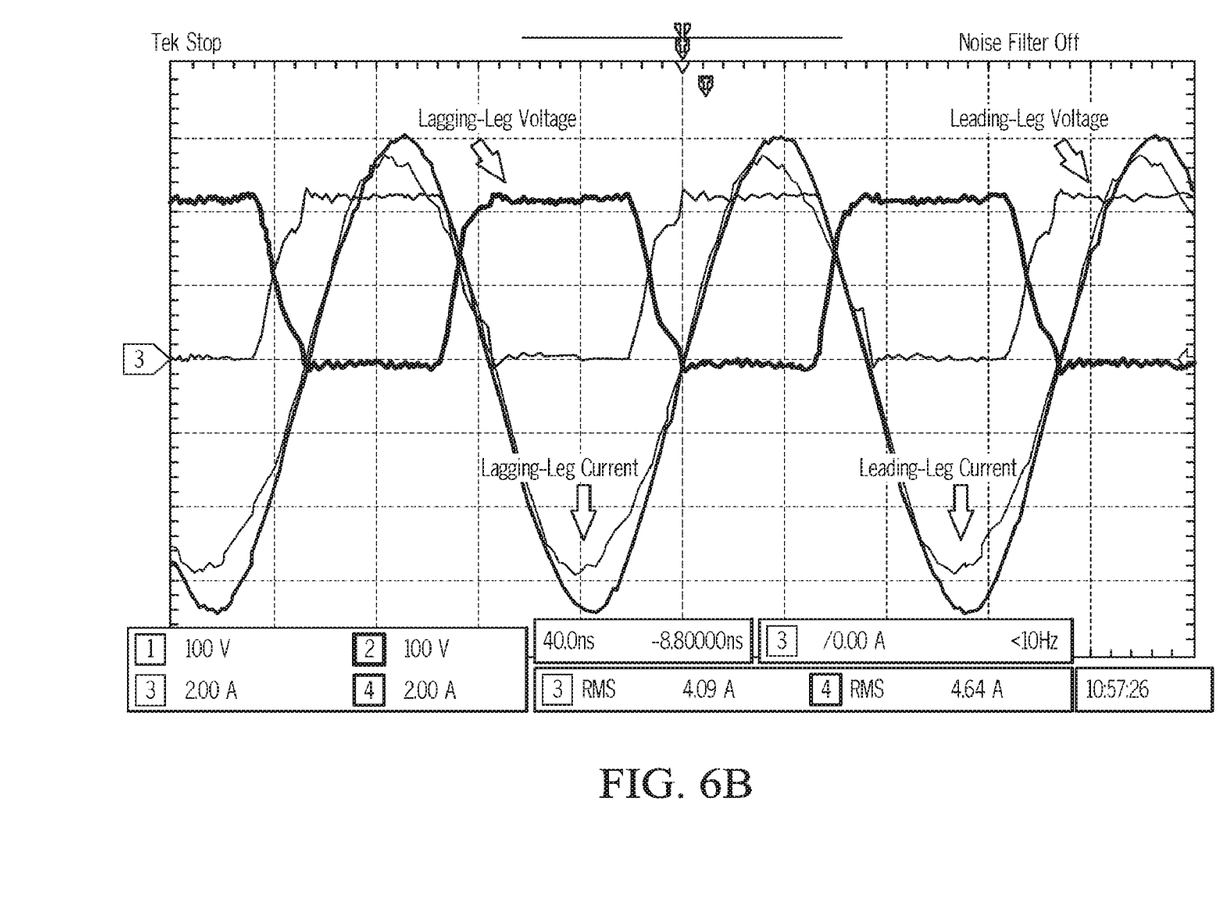
Figure 6C:
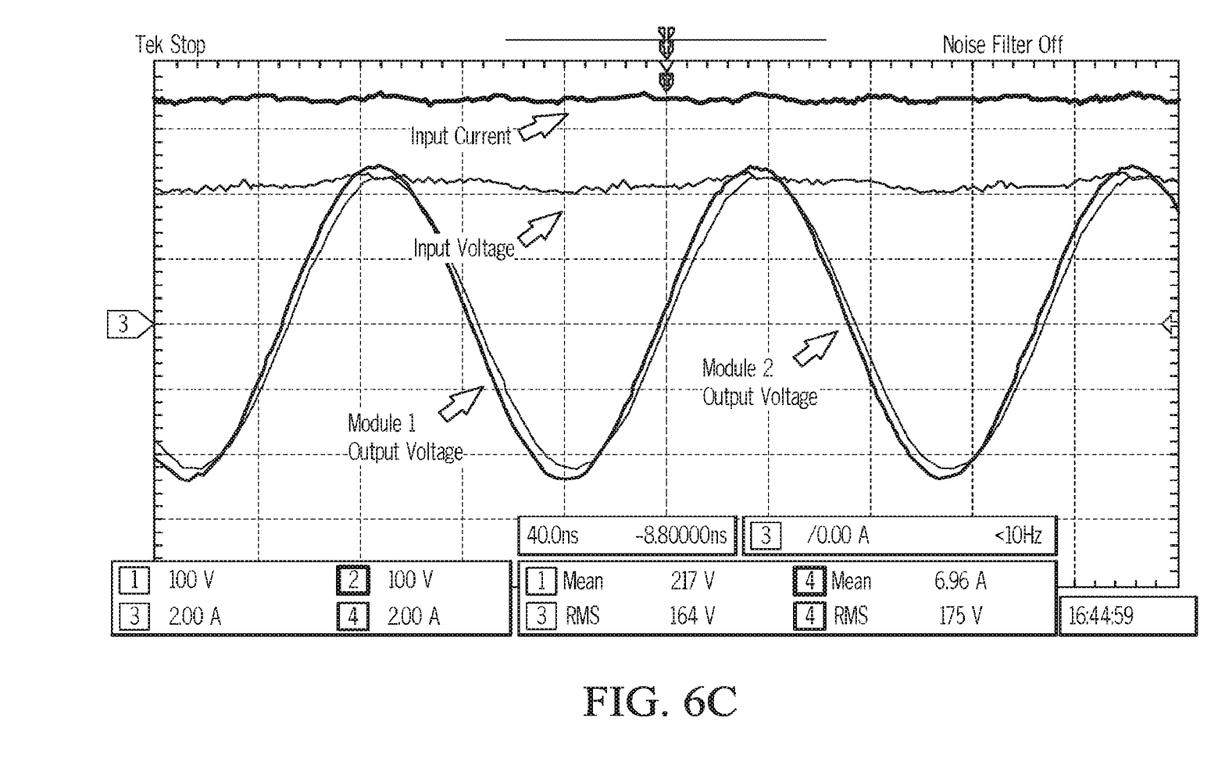
Figure 7:
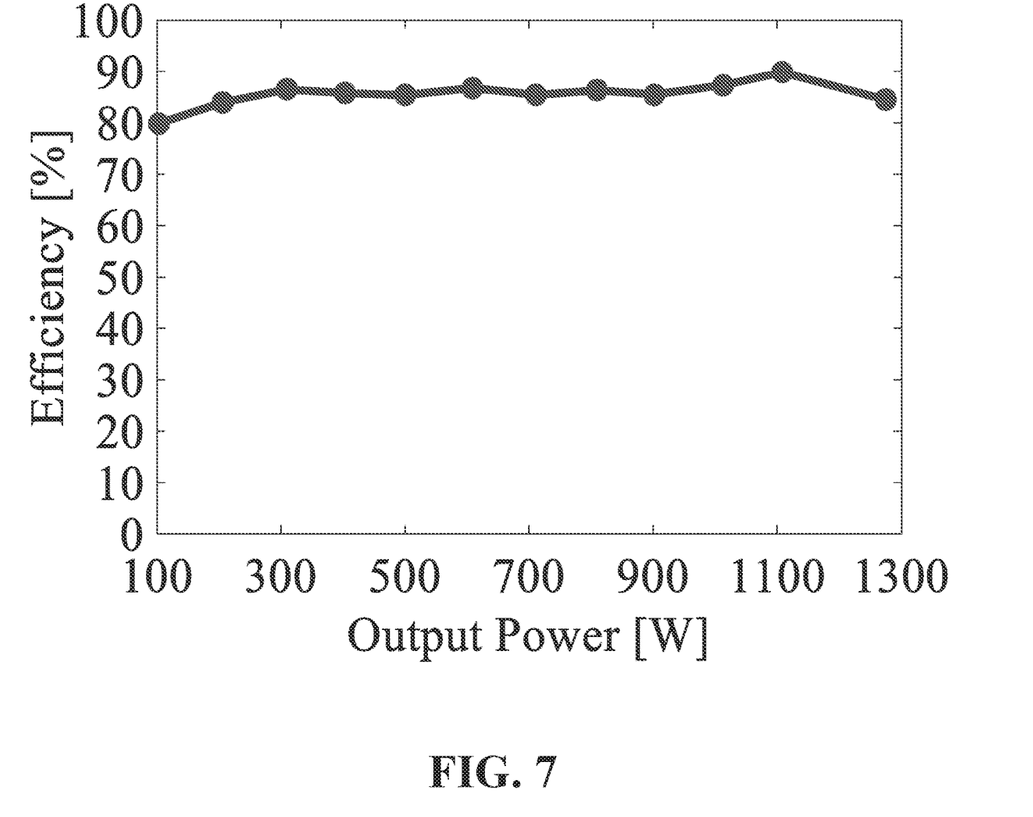
FIG. 7 illustrates a graph showing a measured efficiency of the prototype multi-modular system as a function of its output power.
Figure 8:
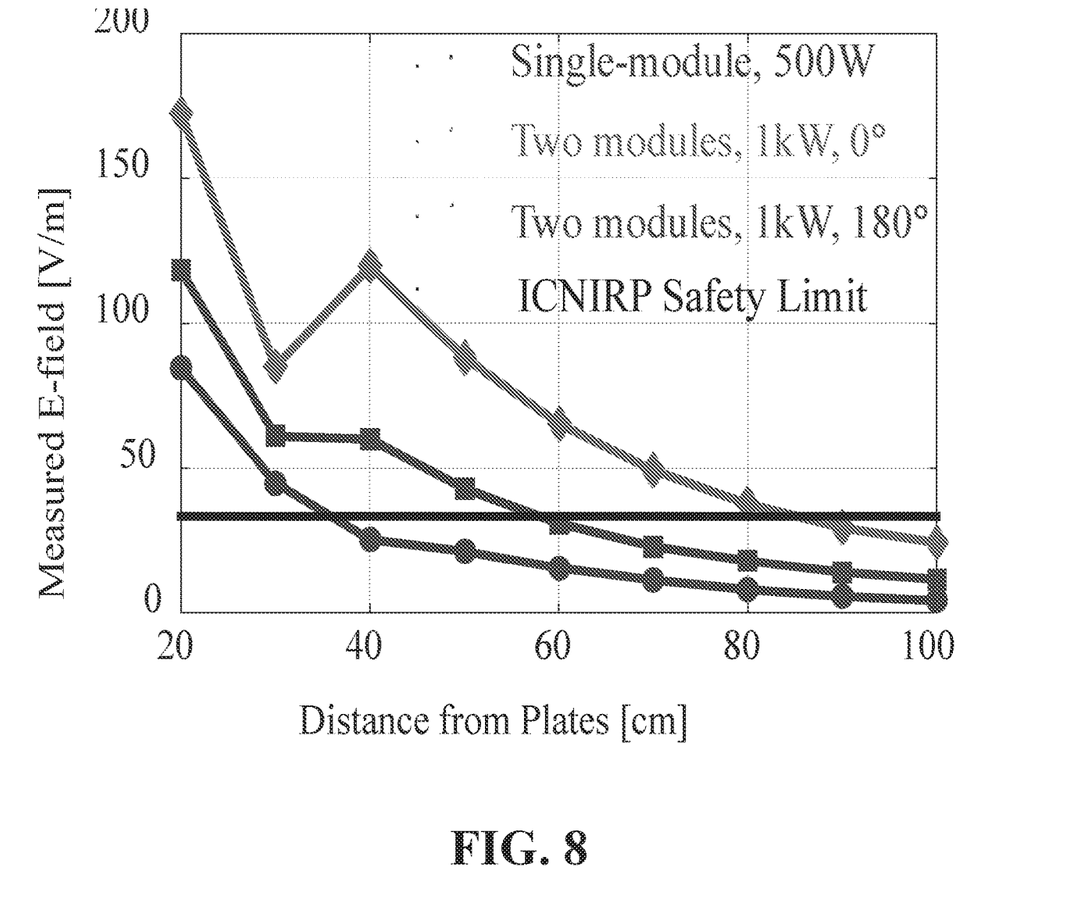
FIG. 8 illustrates a graph showing measured fringing electric field magnitude as a function of distance from the coupling plates, for three different configurations of the capacitive WPT system.

An example prototype 1.2-kW 6.78-MHz 12-cm air-gap multi-modular capacitive WPT system utilizing 12.25-cm× 12.25-cm coupling plates has been designed, built and tested. This prototype comprises two identical 600-W modules similar to those shown in FIG. 3, with the one difference being that the rectifier and battery are emulated by resistors. A photograph of the prototype system is shown in FIG. 5. The aluminum sheets 120 visible in FIG. 5 are used to mimic the road and the vehicle chassis, and the vertical distance between these sheets and the coupling plates is controlled to realize the desired matching network capacitances. The matching network inductors 122 are realized as single-layer air-core solenoids. Values of the coupling capacitance, the matching network inductances and capacitances, and the load resistance of the prototype system are provided in Table I. The inverters of the prototype system are constructed using 650-V 22.5-A GaN Systems GS66506T enhancement-mode GaN transistors. Measured waveforms of the prototype multi-modular system while transferring 1275 W are shown in FIG. 6. It can be seen from FIGS. 6(a) and 6(b) that the inverters of both modules operate with zero-voltage switching (ZVS). The measured efficiency of the multi-modular system is shown as a function of its output power in FIG. 7. As can be seen, the prototype system maintains a flat efficiency across the entire output power range, and achieves a peak efficiency of 89.8%. The 1.2-kW prototype achieves a power transfer density of 21.2 kW/m$^2$, which, to the authors' best knowledge, is more than five times higher than the state-of-the-art in capacitive WPT systems, and comparable to inductive WPT systems for EV charging.

TABLE I

SELECT CIRCUIT PARAMETERS OF THE PROTOTYPE CAPACITIVE WPT SYSTEM

| $C_{plate}$ [pF] | $L_1$ [µH] | $L_2$ [µH] | $C_{ps1}$ [pF] | $C_{ps2}$ [pF] | $R_{load}$ [Ω] |
|---|---|---|---|---|---|
| 0.88 | 53 | 53 | 9.58 | 9.58 | 45 |

The fringing electric fields of the 1.2-kW multi-modular system have also been measured. For these measurements, the system was operated in three configurations: first, with only one module active and delivering 500 W; second, with both modules active, delivering a total of 1 kW, and operating at 0° phase relative to one another; and third, with both modules active, again delivering 1 kW, but operating at 180° phase relative to one another. A plot of the measured fringing electric field magnitude as a function of distance from the edge of the coupling plates for all three configurations is shown in FIG. 9. As can be seen from FIG. 9, the fringing fields in the 0°-phased 1-kW multi-modular configuration (shown in red) are significantly higher than those in the 500-W single-module configuration (shown in blue). However, the fringing fields in the 180°-phased 1-kW multi-modular configuration (shown in green) are substantially lower than even the 500-W single-module configuration, with an average reduction of nearly 50%. This reduction in fringing electric fields enables the 180°-phased 1-kW multi-modular system to meet the 33.4 V/m ICNIRP electric field safety limit (see, e.g., International Commission on Non-Ionizing Radiation Protection, "ICNIRP Guidelines for Limiting Exposure to Time-Varying Electric, Magnetic and Electromagnetic Fields (1 Hz to 100 kHz)," *Health Physics*, vol. 99, no. 6, pp. 818-836, December 2010) shown in black in FIG. 9, at a distance of 36 cm away from the edge of the coupling plates, as compared to a distance of 58 cm for the 500-W single module and 85 cm for the 0°-phased 1-kW system.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

The implementations described herein are implemented as logical steps in one or more computer systems. The logical operations are implemented (1) as a sequence of processor-implemented steps executing in one or more computer systems and (2) as interconnected machine or circuit modules within one or more computer systems. The implementation is a matter of choice, dependent on the performance requirements of a particular computer system. Accordingly, the logical operations making up the embodiments and/or implementations described herein are referred to variously as operations, steps, objects, or modules. Furthermore, it should be understood that logical operations may be performed in any order, unless explicitly claimed otherwise or a specific order is inherently necessitated by the claim language.

The above specification, examples and data provide a complete description of the structure and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

Furthermore, certain operations in the methods described above must naturally precede others for the described method to function as described. However, the described methods are not limited to the order of operations described if such order sequence does not alter the functionality of the method. That is, it is recognized that some operations may be performed before or after other operations without departing from the scope and spirit of the claims.

It is important to recognize, that while certain implementations described herein refer to optimization of one or more feature, system, operation, method, process or the like, actual mathematical or other optimization is not required in other implementations. While it may be possible to "optimize" a particular campaign, one of ordinary skill in the art would recognize from the teachings of the present disclosure, the similar techniques, systems and processes could also be used to improve campaigns, ad delivery or the like without achieving absolute optimization. Rather, different implementations provide for optimization or improved operation, planning, achievement, delivery, etc. of advertising campaigns.

Also, while example time periods and other variables were used to describe various implementations, other time periods and variables may be used instead.

What is claimed:

1. A multi-modular capacitive wireless power transfer (WPT) circuit for electric vehicle (EV) charging comprising a plurality of modules, wherein each module comprises:
a WPT coupler comprising a first pair of conducting plates coupled to the WPT coupler input port, and a second pair of conducting plates coupled to the WPT coupler output port, wherein the first and second pair of conducting plates are separated by an air-gap;
an inverter circuit comprising an inverter circuit input port and an inverter circuit output port, the inverter circuit input port coupled to the WPT circuit input port;
a rectifier circuit comprising a rectifier circuit input port and a rectifier circuit output port, the rectifier circuit output port coupled to the WPT circuit output port;
a first reactive network comprising a first reactive network input port and a first reactive network output port, wherein the first reactive network input port is coupled to the inverter circuit output port, and the first reactive network output port is coupled to the WPT coupler input port;
a second reactive network comprising a second reactive network input port and a second reactive network output port, wherein the second reactive network input port is coupled to the WPT coupler output port, and the second reactive network output port is coupled to the rectifier circuit input port;
wherein the first and second reactive networks are adapted to provide a voltage and/or current gain and compensation for the reactance of the WPT coupler, the inverter circuits of adjacent modules are operated at a phase-shift of approximately 180 degrees relative to one another to at least partially cancel fringing electric fields; and the parasitic capacitances that exist between the WPT couplers of the adjacent modules are modeled by equivalent capacitances inside the individual modules.

2. The multi-modular capacitive WPT circuit of claim 1 wherein the first and second reactive networks of each module comprise L-section matching networks, with the inductors of the L-section matching networks symmetrically split into two equal halves, with the first half placed in the forward path of the module and the second half placed in the return path of the module;
wherein the symmetric design is adapted to at least partially decouple the modules from one another by absorbing the parasitic capacitances that exist between the WPT couplers of the modules and road and vehicle chassis into the individual modules.

3. The multi-modular capacitive WPT circuit of claim 2, wherein the parasitic capacitances that exist between the WPT couplers of the modules, and between the WPT couplers and the vehicle chassis and road, are utilized to at least partially realize the capacitors of the L-section matching networks of the modules.

4. The multi-modular capacitive WPT circuit of claim 1 wherein the first pair of conducting plates is coupled to an energy charging source and the second pair of conducting plates is coupled to a vehicle.

5. A method of controlling a multi-modular capacitive wireless power transfer (WPT) circuit for electric vehicle (EV) charging comprising a plurality of modules,
wherein the method comprises:
providing a WPT circuit comprising:
a WPT coupler comprising a first pair of conducting plates coupled to the WPT coupler input port, and a second pair of conducting plates coupled to the WPT coupler output port, wherein the first and second pair of conducting plates are separated by an air-gap;
an inverter circuit comprising an inverter circuit input port and an inverter circuit output port, the inverter circuit input port coupled to the WPT circuit input port;
a rectifier circuit comprising a rectifier circuit input port and a rectifier circuit output port, the rectifier circuit output port coupled to the WPT circuit output port;
a first reactive network comprising a first reactive network input port and a first reactive network output port, wherein the first reactive network input port is coupled to the inverter circuit output port, and the first reactive network output port is coupled to the WPT coupler input port;
a second reactive network comprising a second reactive network input port and a second reactive network output port, wherein the second reactive network input port is coupled to the WPT coupler output port, and the second reactive network output port is coupled to the rectifier circuit input port; and
providing a voltage and/or current gain and compensation for the reactance of the WPT coupler via the first and second reactive networks,
operating the inverter circuits of adjacent modules at a phase-shift of approximately 180 degrees relative to one another to at least partially cancel fringing electric fields, wherein the parasitic capacitances that exist between the WPT couplers of the adjacent modules are modeled by equivalent capacitances inside the individual modules.

6. The method of claim 5 wherein the first and second reactive networks of each module comprise L-section matching networks, with the inductors of the L-section matching networks symmetrically split into two equal halves, with the first half placed in the forward path of the module and the second half placed in the return path of the module;
wherein the symmetric design is adapted to at least partially decouple the modules from one another by absorbing the parasitic capacitances that exist between the WPT couplers of the modules and road and vehicle chassis into the individual modules.

7. The method of claim 6, wherein the parasitic capacitances that exist between the WPT couplers of the modules, and between the WPT couplers and the vehicle chassis and road, are utilized to at least partially realize the capacitors of the L-section matching networks of the modules.

8. The method of claim 6 wherein a first pair of conducting plates is coupled to an energy charging source and the second pair of conducting plates is coupled to a vehicle.

9. A multi-modular capacitive wireless power transfer (WPT) system for electric vehicle (EV) charging comprising:
an energy charging source;
a vehicle;
a plurality of modules, wherein each module comprises:
a WPT coupler comprising a first pair of conducting plates coupled to the energy charging source via a WPT coupler input port, and a second pair of conducting plates coupled to an energy storage device of the vehicle via a WPT coupler output port, wherein the first and second pair of conducting plates are separated by an air-gap;

an inverter circuit comprising an inverter circuit input port and an inverter circuit output port, the inverter circuit input port coupled to the WPT circuit input port;

a rectifier circuit comprising a rectifier circuit input port and a rectifier circuit output port, the rectifier circuit output port coupled to the WPT circuit output port;

a first reactive network comprising a first reactive network input port and a first reactive network output port, wherein the first reactive network input port is coupled to the inverter circuit output port, and the first reactive network output port is coupled to the WPT coupler input port;

a second reactive network comprising a second reactive network input port and a second reactive network output port, wherein the second reactive network input port is coupled to the WPT coupler output port, and the second reactive network output port is coupled to the rectifier circuit input port;

wherein the first and second reactive networks are adapted to provide a voltage and/or current gain and compensation for the reactance of the WPT coupler, the inverter circuits of adjacent modules are operated at a phase-shift of approximately 180 degrees relative to one another to at least partially cancel fringing electric fields; and the parasitic capacitances that exist between the WPT couplers of the adjacent modules are modeled by equivalent capacitances inside the individual modules.

10. The multi-modular capacitive WPT system of claim 9 wherein the first and second reactive networks of each module comprise L-section matching networks, with the inductors of the L-section matching networks symmetrically split into two equal halves, with the first half placed in the forward path of the module and the second half placed in the return path of the module;

wherein the symmetric design is adapted to at least partially decouple the modules from one another by absorbing the parasitic capacitances that exist between the WPT couplers of the modules and road and vehicle chassis into the individual modules.

11. The multi-modular capacitive WPT system of claim 10, wherein the parasitic capacitances that exist between the WPT couplers of the modules, and between the WPT couplers and the vehicle chassis and road, are utilized to at least partially realize the capacitors of the L-section matching networks of the modules.

* * * * *